United States Patent
Wilkinson

[19]

[11] Patent Number: 6,145,444
[45] Date of Patent: Nov. 14, 2000

[54] MICRO CLEAN SEALED TUBULAR TRANSPORTER APPARATUS

[76] Inventor: Kerry E. Wilkinson, 5750 W. Linda La., Chandler, Ariz. 85226

[21] Appl. No.: 09/212,592

[22] Filed: Dec. 16, 1998

[51] Int. Cl.[7] ............................................. B61B 13/10
[52] U.S. Cl. .......................... 104/138.1; 104/138.2; 104/281; 104/282; 414/217
[58] Field of Search ..................... 104/138.1, 138.2, 104/156, 165, 282, 281; 406/51; 414/217

[56] References Cited

U.S. PATENT DOCUMENTS

| | | | |
|---|---|---|---|
| 3,996,858 | 12/1976 | Sangl | 104/138.1 |
| 4,305,334 | 12/1981 | Augenreich et al. | 104/138.1 |
| 4,540,326 | 9/1985 | Southworth et al. | 414/217 |
| 4,649,830 | 3/1987 | Tanaka | 104/138.1 |
| 4,718,539 | 1/1988 | Fukuwatari et al. | . |
| 4,722,659 | 2/1988 | Hoyt, III et al. | . |
| 4,826,360 | 5/1989 | Iwasawa et al. | 406/51 |
| 4,852,497 | 8/1989 | Tsui | 104/138.1 |
| 4,881,469 | 11/1989 | Hirtz | 104/138.1 |
| 4,904,153 | 2/1990 | Iwasawa et al. | . |
| 4,908,533 | 3/1990 | Karita et al. | . |
| 4,923,352 | 5/1990 | Tamura et al. | . |
| 5,180,048 | 1/1993 | Kawada et al. | . |
| 5,241,912 | 9/1993 | Oshima et al. | 104/138.1 |
| 5,363,867 | 11/1994 | Kawano et al. | . |
| 5,417,537 | 5/1995 | Miller | 414/217 |
| 5,433,155 | 7/1995 | O'Neill et al. | 104/138.1 |
| 5,443,346 | 8/1995 | Murata | . |
| 5,513,573 | 5/1996 | Sutton | 104/138.1 |
| 5,547,328 | 8/1996 | Bonora et al. | . |
| 5,564,339 | 10/1996 | Miura et al. | 104/156 |
| 6,013,920 | 1/2000 | Gordon et al. | 250/559.36 |

*Primary Examiner*—S. Joseph Morano
*Assistant Examiner*—Lars A. Olson
*Attorney, Agent, or Firm*—H. Gordon Shields

[57] ABSTRACT

Apparatus for transporting elements in a clean room environment includes a tubular element having a positive air pressure therein for providing a clean air environment and a cart movable in the tubular element. The cart may be movable by either an external propulsion system to which the cart is coupled or by an internal system to which the cart is coupled.

5 Claims, 3 Drawing Sheets

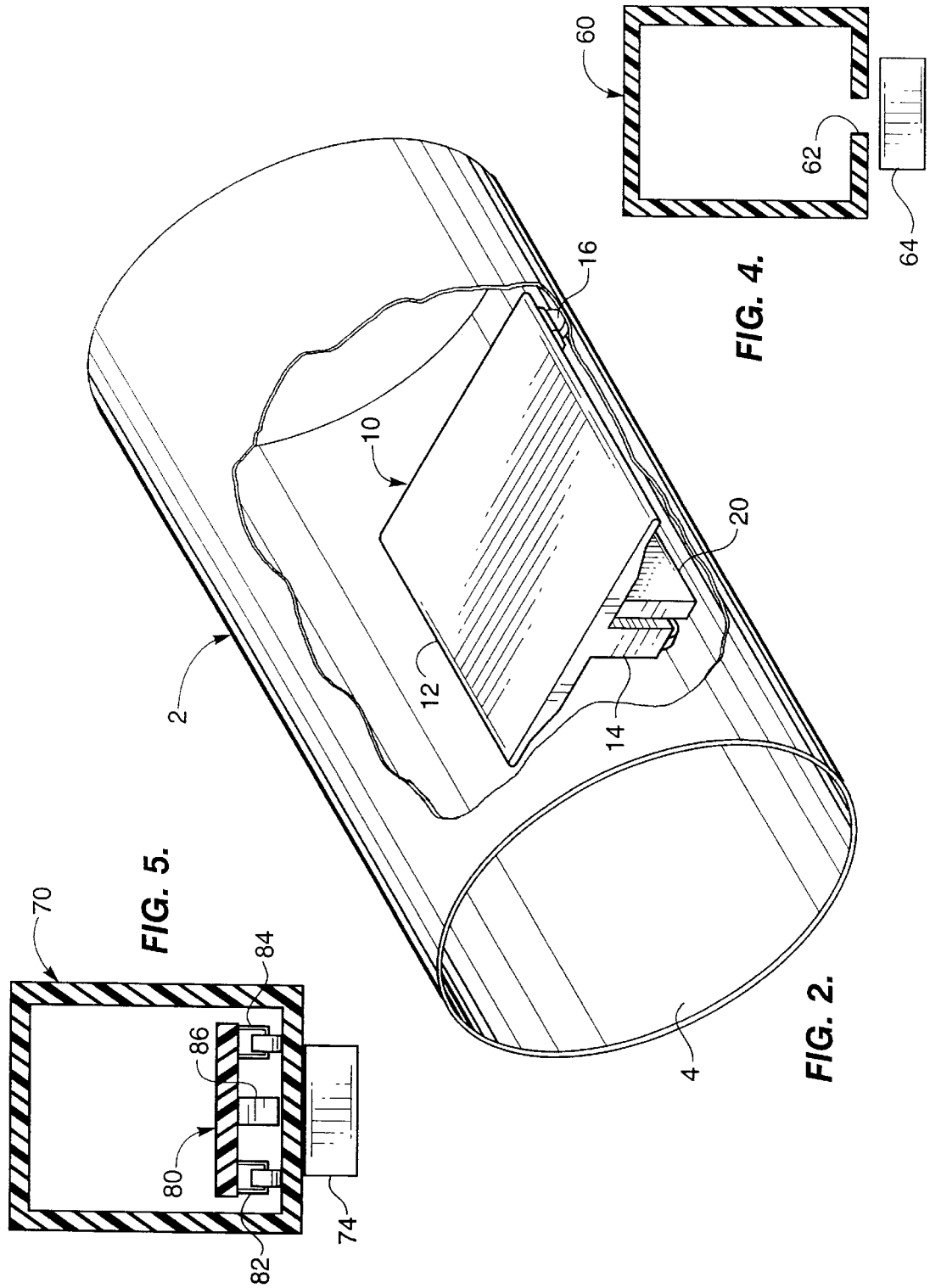

MICRO CLEAN SEALED TUBULAR TRANSPORTER APPARATUS

BACKGROUND OF THE INVENTION

1. Field of the Invention

This invention relates to the transporting of materials in a clean and sealed environment as the materials are transported between work stations.

2. Description of the Prior Art

Typically, clean room environments require that entire rooms be "clean" and that personnel in the rooms also be "clean" and appropriately garbed. The filtration system requirements are rather strenuous for such clean room activities, and personnel enter and exit through special entryways in order to maintain the integrity of the clean rooms. Elements being processed within the clean room, such as semiconductor wafers or circuit boards, are typically transported by personnel from work station to work station. The wafers themselves are disposed in cassettes, each cassette of which holds a plurality of wafer elements for processing.

Conveyer systems in such clean rooms vary rather greatly. As indicated above, the typical situation is simply the loading of the cassettes full of wafers, or comparable transport elements for integrated circuit boards, and manually carrying to transport between work stations.

U.S. Pat. No. 4,826,360 (Iwasawa et al) discloses a transfer system in a clean room. In the '360 patent, elements being transferred comprise semiconductor wafer cassettes. Transfer tubes are used, and a vehicle is disposed within the transfer tube. A pod moves within the tube on a vehicle. The tube is evacuated to produce a negative pressure so that the vehicle is moved in the transfer tube by negative pressure.

U.S. Pat. No. 4,923,352 (Tamura et al) discloses a clean room system in which semiconductor elements may be processed. The system includes a plurality of filters, blower systems, and a clean room disposed on a second story. A robot is used to transport material being processed between processing stations.

U.S. Pat. No. 4,718,539 (Fukuwatari et al) discloses a conveyor system for transporting parts on a transport pallet. Compressed air is used as the motive force.

U.S. Pat. No. 4,722,659 (Hoyt, III et al) discloses a semiconductor wafer carrier transport apparatus in which semiconductor wafers are disposed in plastic cassettes and the plastic cassettes are transported between carriers.

A robot transport system for transporting semiconductor wafers is disclosed in U.S. Pat. No. 4,904,153 (Iwasawa et al).

U.S. Pat. No. 4,908,533 (Karita et al) discloses a linear motor transport apparatus. Such apparatus may be used in transporting the subject matter of the present invention and related apparatus.

A magnetic levitating transport system is disposed in U.S. Pat. No. 5,180,048 (Kawada et al). Again, such transportation system may be applicable to the apparatus of the present invention.

U.S. Pat. No. 5,363,867 (Kawano et al) discloses a storage area in a clean room. Wafer cassettes are disposed in the storage area.

U.S. Pat. No. 5,417,537 (Miller) discloses a wafer transport apparatus between processing areas. A magnetic levitation system is used for transporting the material carrier between stations.

U.S. Pat. No. 5,443,346 (Murata et al) discloses a system for conveying wafers in a clean room.

U.S. Pat. No. 5,547,328 (Bonora et al) discloses a transport system for transferring articles between controlled environments. The apparatus transports the same type of pods referred to above, in the '360 patent.

Most of the above discussed patents deal with entire clean rooms which require a substantial amount of air filtering, special structural elements, and the like, for such clean rooms. The apparatus of the present invention substantially reduces the complexity of clean room environments by providing smaller sealed environments in which materials being processed, such as semiconductor wafers, may be transported from one processing area to another. Personnel involved in the processing and most of the processing machinery may be disposed outside of the smaller transport clean area. Tubes in which the materials are transported remain relatively sealed with a positive pressure.

SUMMARY OF THE INVENTION

The invention described and claimed herein comprises a transport system for transporting materials to be processed between processing stations. The transport system includes a tube in which a positive pressure helps to maintain the integrity of the clean environment within the tube. Carts move in the tube to transport elements, such as wafer cassettes between areas. Transport carts in the tubes are coupled to an outer drive or to an inner drive. Appropriate coupling may include magnetic coupling, a linear motor, physical coupling of a pin through a slot in tube, or other appropriate motivation elements.

Among the objects of the present invention are the following:

To provide new and useful apparatus for transporting elements to be processed between processing stations;

To provide new and useful tubular apparatus for transporting elements;

To provide new and useful clean room environment in a tube in which materials to be processed are transported;

To provide new and useful transport apparatus including a tubular member having a positive pressure therein and a cart movable therein for transporting desired elements for processing.

BRIEF DESCRIPTION OF THE DRAWING

FIG. 2 is a perspective view of the apparatus illustrated in FIG. 1.

FIG. 4 is view in partial section of an alternate embodiment of a portion of the apparatus of the present invention.

FIG. 5 is a view in partial section of another alternate embodiment of a portion of the apparatus of the present invention.

DESCRIPTION OF THE PREFERRED EMBODIMENT

Figure 1:
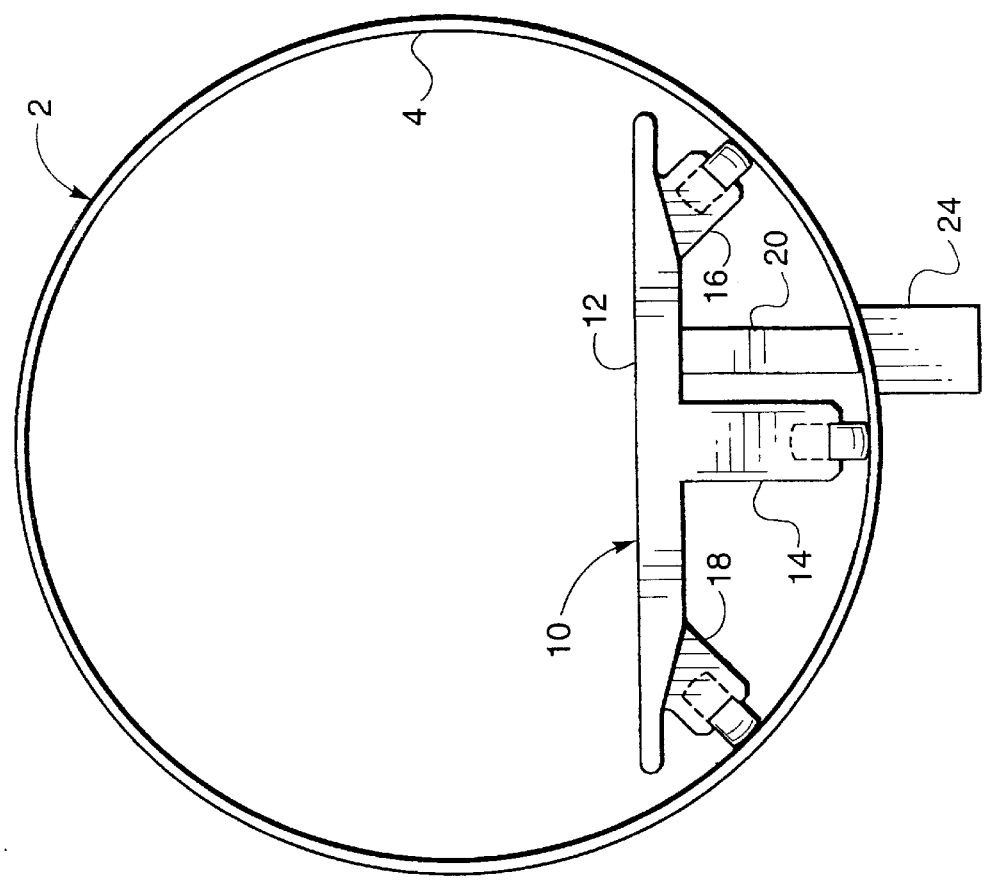
FIG. 1 is an end view of the apparatus of the present invention.

FIG. 1 is an end view of a tubular member 2 with a cart 10 movable therein. The tubular member 2 includes an inner periphery 4 on which the cart 10 is disposed and in which it moves by virtue of three wheel units, including a wheel unit 14, a wheel unit 16, and a wheel unit 18.

FIG. 2 is a perspective view through the tube 2 showing the cart 10 disposed therein. As best shown in FIG. 2, the wheel units 14, 16, and 18 provide a tricycle type wheel support system for the cart 10.

The top of the cart 10 comprises a platform 12 on which material to be transported within the tube 2 is disposed. The tubular member 2 is shown as having a circular cross section, that will be understood that it may be square or rectangular, or any other configuration, as appropriate and as desired. Moreover, the tricycle type wheel elements of the cart 10 may be as desired or as appropriate for the load carried on the platform 12 of the cart 10 and as appropriate for the cross sectional configuration of the tubular element.

The tubular element 2 is preferably a clear plastic element, such as acrylic, or the like, for convenience in observing the cart 10, or perhaps a plurality of carts 10, used in a clean room type environment. The interior of the tubular element 2 will be pressurized as required to maintain a clean room environment. The atmosphere will, of course, be appropriately filtered to maintain a clean room environment.

For moving the cart 10 within the tubular element 10, a magnetic coupling element 20 is shown extending downwardly to adjacent to the wall of the tubular element 2 and an exterior propulsion unit 24 is shown disposed beneath the tubular element 2. The propulsion unit 24 may be a linear motor or any other appropriate type of propulsion system which will couple to the magnetic element 20 to move the cart 10 within the tube 2.

With a tricycle type suspension system or wheel system, the cart 10 is able to conveniently negotiate curved portions of the tube 2, as required for transporting wafers, or the like, in appropriate containers on the platform 12 of the cart 2. Obviously, FOUPS (Front Opening Unified Pods) may also be disposed on the platform 12 to be transported as required. The size of the tube 2 will vary according to the desired loads or elements to be transported on the cart 10.

Figure 3:
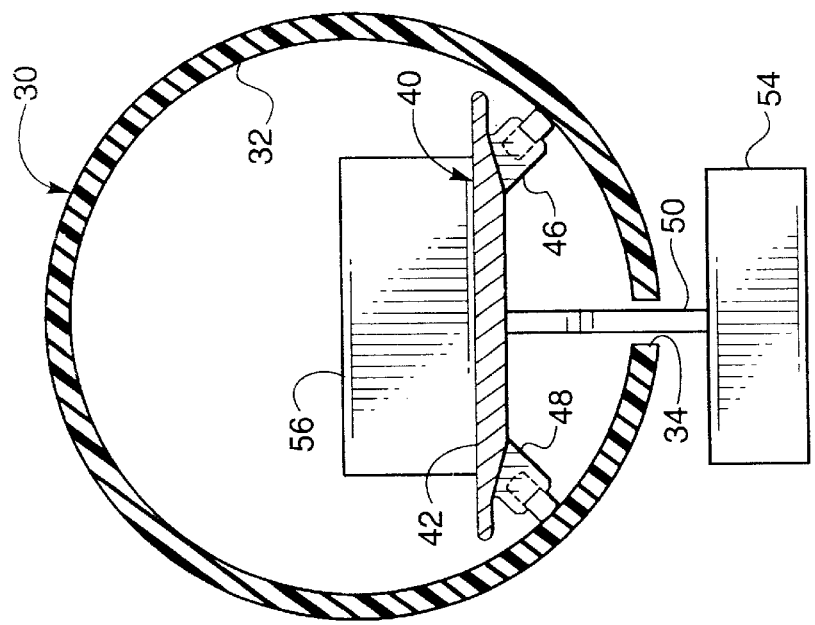
FIG. 3 is a view in partial section of an alternate embodiment of the apparatus of FIGS. 1 and 2.

FIG. 3 is a view in partial section through a tubular member 30 with a cart 40 disposed therein.

The apparatus of FIG. 3 varies from the apparatus of FIGS. 1 and 3 in the propulsion system used for the cart 40. The tube 30 is again preferably a clear tubular element which may have a circular cross section configuration or any other desired cross sectional configuration. And, once again, wheel elements for the cart 40 may include a tricycle type suspension, which includes a pair of wheel elements 46 and 48. A desired load 56 is shown disposed on the platform 42 of the cart 40.

The tube 30 includes an inside periphery 32 and a bottom slot 34 through which extends a pin 50. The pin 50 is secured to both the cart 40 and to an external propulsion unit 54. The propulsion unit 54 may be a motorized unit or any other appropriate propulsion system to which the pin 50 is secured for moving the cart 40 within the tube 30.

With the slot 34 extending through the tube 30, there needs to be sufficient positive pressure within the tube 30 to prevent the intrusion of particle element which may contaminate the clean room environment maintained within the tube 30.

FIG. 4 is a view in partial section through an alternate embodiment tubular element, namely a square (a rectangle with four equal sides) tubular element 60. The tubular element 60 is an alternate to the round tubular elements illustrated in FIGS. 1, 2, and 3.

The tubular element 40 includes a slot 62, and a propulsion unit 64 is disposed beneath the slot 62. The square tubular unit 60 is designed to operate with the cart apparatus 40 of FIG. 3. That is, a pin secured to a cart is connected to the propulsion unit 64 to move the cart through the tube 60.

FIG. 5 is a view in partial section of a generally rectangular unit 70, in which the vertical dimension is greater than the width dimension. The tubular element 70 does not include a slot, but a propulsion unit 74 is disposed adjacent to the propulsion unit 70. The propulsion unit 74 uses magnetic coupling, such as illustrated in FIG. 1, in which a magnetic coupling unit 20 secured to the cart 10 is in turn coupled to the propulsion unit 24. A four-wheeled cart 80 is shown disposed within a rectangular tubular element 70. The cart 80 is shown in partial section, and two wheel units 82 and 84 are illustrated. A magnetic coupling element 86 extends downwardly from the bottom of the cart 80 for coupling to the propulsion unit 74.

Obviously, the tubular element 70 may include a slot, such as the slot 62, of FIG. 4, and the tubular element 60 may utilized the magnetic coupling rather than the slot 62.

Figure 6:
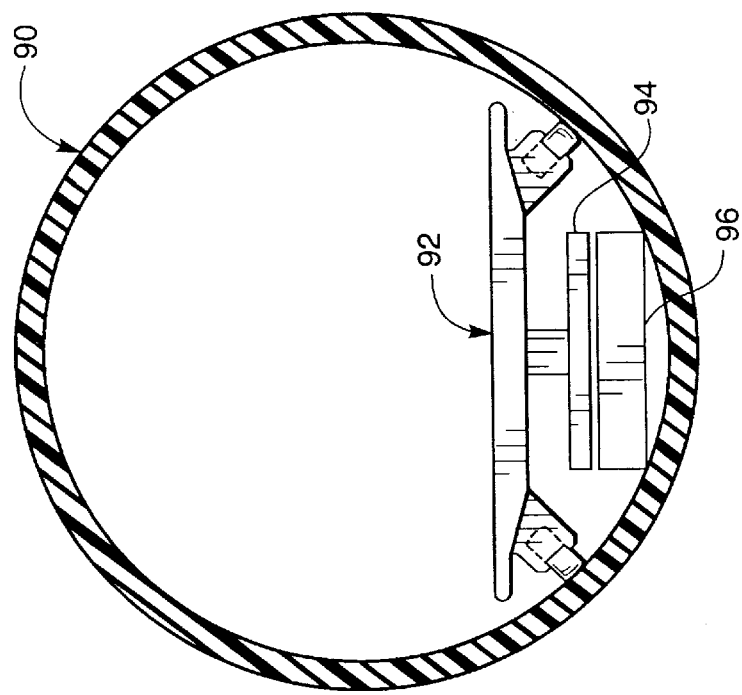
FIG. 6 is a view in partial section of another alternate embodiment of the apparatus of the present invention.

FIG. 6 comprises a view in partial section of another alternate embodiment of the apparatus of the present invention. The apparatus of FIG. 6 includes a tube 90, which is illustrated as a round tube, but which may also be rectangular, or square, which is, of course, also a rectangle, since it has four right angles, as all rectangles do, and the four sides are equal. Within the tube 90 is a cart 92. It will be noted that the cart 92, rather than having a tricycle type wheel suspension, is now a four wheeled cart, of which only two are illustrated. The reason for the four wheel suspension of the cart 92 is due to the propulsion system, which is internal. A coupling element 94 is secured to the cart 92, and extends downwardly from the bottom of the cart. The element 94 is coupled to an internal propulsion system 96. The propulsion system 96 may be a linear motor, or the like, which is disposed within the tube 90.

With the propulsion system 96 disposed within the tube 90, the necessity of a slot is eliminated, and also the coupling element 94 may be located much closer to the propulsion system 96 in such an enclosed system. Thus, the apparatus of the present invention is flexible enough to suit the various requirements of differing circumstances found in the various industry needs.

Returning again to FIG. 1, another alternate propulsion system may be employed. The alternate propulsion system utilizes electromagnetic coupling. In such case, the element 20 is a ferritic rod, and the element 24 is an electromagnetic coil system. Such propulsion system has advantages, such as ease in starting and stopping, for certain applications.

Similarly, the propulsion system for the cart 92 in FIG. 6 may be an electromagnetic system, such as referred to in the preceding paragraph, or a linear motor system, such as discussed above.

Figure 7:
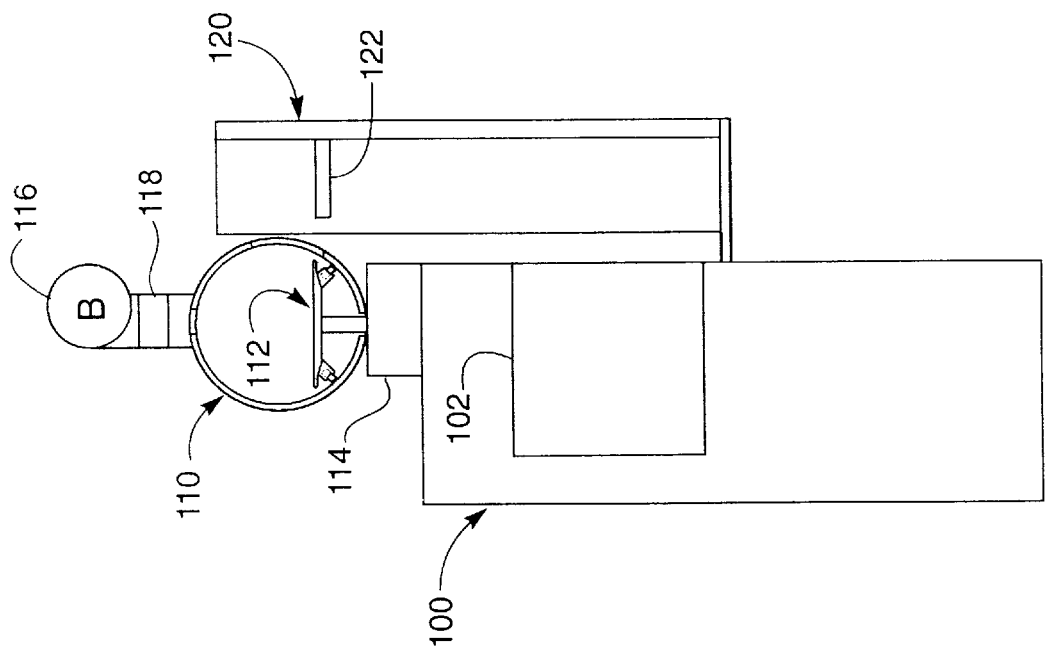
FIG. 7 is a schematic representation of the use environment of the apparatus of the present invention.

FIG. 7 comprises a schematic representation of the use environment of the apparatus of the present invention. FIG. 7 schematically represents a processing station 100 at which is disposed a processing unit 102. A generally round tube 110 is disposed above the work station 100. A cart 112 is shown disposed within the tube 110. The cart 112 is connected to a propulsion unit 114 by a pin, such as illustrated in FIG. 3. That is, the cart 112, its pin, and its propulsion unit or system 114, is similar to that illustrated in FIG. 3 and discussed above.

Above the tube 100 is a blower 116. Between the blower 116 and the tube 110 is a filter unit 118. The filter unit 118 may typically be referred to as an HEPA filter.

Adjacent to both the work station 100, and particularly the processing unit 102, and the transport tube 110, is a material transfer unit 120. The material transfer unit 120 includes a vertical elevator element 122 which receives material to be processed from the platform of the cart 112 and moves the material downwardly to the processing unit 102.

In a room, there will be a number of processing stations 100, and the tube 110 extends above them all. The processing stations may be in a configuration of a "U" with the tube 110 making the appropriate curves at the corners of the "U". There will be a number of the material transfer units 120 that corresponds with the number of processing stations involved in a particular operation.

The tube 110 may be connected to a number of rooms, if desired, for the appropriate processing of semi-conductor wafers, or the like.

The configuration of the tube 110 may be round or rectangular, as illustrated, or any other appropriate configuration. For some applications, some other configurations, such as elliptical or hexagonal, or other, may be desired. Moreover, the propulsion unit or system 114 may be other than the systems discussed above as exemplary. For example, a mechanical propulsion or movement system coupled to a cart may be appropriate for some applications. There are, obviously different systems for moving a cart in a tube, and a particular system may be adapted for a particular application.

The use of the controlled environment of the tube 110 substantially eliminates the need for a complete clean room environment, with the attendant cost, etc., of the prior art.

While the principles of the invention have been made clear in illustrative embodiments, there will be immediately obvious to those skilled in the art many modifications of structure, arrangement, proportions, the elements, materials, and components used in the practice of the invention, and otherwise, which are particularly adapted to specific environments and operative requirements without departing from those principles. The appended claims are intended to cover and embrace any and all such modifications, within the limits only of the true spirit and scope of the invention.

What I claim is:

1. Transport apparatus comprising in combination:

tubular means for receiving a cart movable therein;

a cart disposed in the tubular means for transporting elements in the tubular means;

means for moving the cart in the tubular means including an electromagnetic coil system and a ferritic rod secured to the cart for coupling the cart to the electromagnetic coil system; and means for pressurizing the tubular means.

2. The apparatus of claim 1 in which the tubular means comprises a round tube.

3. The apparatus of claim 2 in which the means for moving the cart is disposed inside the tubular means.

4. The apparatus of claim 1 in which the tubular means comprises a rectangular tube.

5. The apparatus of claim 4 in which the rectangular tube is square.

\* \* \* \* \*